(12) United States Patent
Pawar et al.

(10) Patent No.: US 6,393,385 B1
(45) Date of Patent: May 21, 2002

(54) KNOWLEDGE DRIVEN SIMULATION TIME AND DATA REDUCTION TECHNIQUE

(75) Inventors: Vivek G. Pawar; Srikanth Natarajan; C. Srinivasan, all of Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/656,998

(22) Filed: May 28, 1996

Related U.S. Application Data

(63) Continuation of application No. 08/385,246, filed on Feb. 7, 1995, now abandoned.

(51) Int. Cl.[7] ............................................. G06F 17/50
(52) U.S. Cl. ........................... 703/15; 703/13; 702/117; 706/50
(58) Field of Search ................................. 364/488, 489, 364/578; 371/27.4, 25.1, 27.3; 703/15, 19, 20, 13; 702/117; 706/50, 49; 345/700; 716/5

(56) References Cited

U.S. PATENT DOCUMENTS

| | | | | |
|---|---|---|---|---|
| 4,000,460 A | * | 12/1976 | Kadakia et al. ............ | 324/73 R |
| 4,503,386 A | * | 3/1985 | DasGupta et al. ......... | 324/73 R |
| 4,644,487 A | * | 2/1987 | Smith ......................... | 364/578 |
| 4,670,876 A | * | 6/1987 | Kirk ............................ | 371/3 |
| 4,882,690 A | * | 11/1989 | Shinsha et al. ............. | 364/490 |
| 4,922,445 A | * | 5/1990 | Mizoue et al. ............. | 364/578 |
| 4,939,681 A | * | 7/1990 | Yokomizo et al. ......... | 364/578 |
| 4,967,386 A | * | 10/1990 | Maeda et al. .............. | 364/578 |
| 5,016,204 A | * | 5/1991 | Simoudis et al. .......... | 364/578 |
| 5,051,938 A | * | 9/1991 | Hyduke ..................... | 364/578 |
| 5,210,486 A | * | 5/1993 | Wilson et al. .......... | 324/158 R |
| 5,345,401 A | * | 9/1994 | Tani ........................... | 364/578 |

* cited by examiner

Primary Examiner—Kevin J. Teska
Assistant Examiner—Thai Phan
(74) Attorney, Agent, or Firm—W. Daniel Swayze, Jr.; W. James Brady; Frederick J. Telecky, Jr.

(57) ABSTRACT

A simulator for simulating a digital circuit, includes an input circuit for inputting a test patterns to describe the characteristics of the digital circuit and for inputting input signals to test the operation of digital circuit and output signals to describe the expected output of the digital circuit based on the input signals, an applying circuit to apply the input signal to test the operation of the digital circuit to the test patterns to describe the characteristics of the digital circuit to form a simulated output signal to indicate a response based on the test pattern, a comparator circuit to compare the simulated output signal with the output signal to describe the expected output of the digital circuit based on the input signals to determine a difference between the simulated output signal and the output signals, wherein the operation of the simulation is stopped if the difference is greater than a predetermined difference.

7 Claims, 3 Drawing Sheets

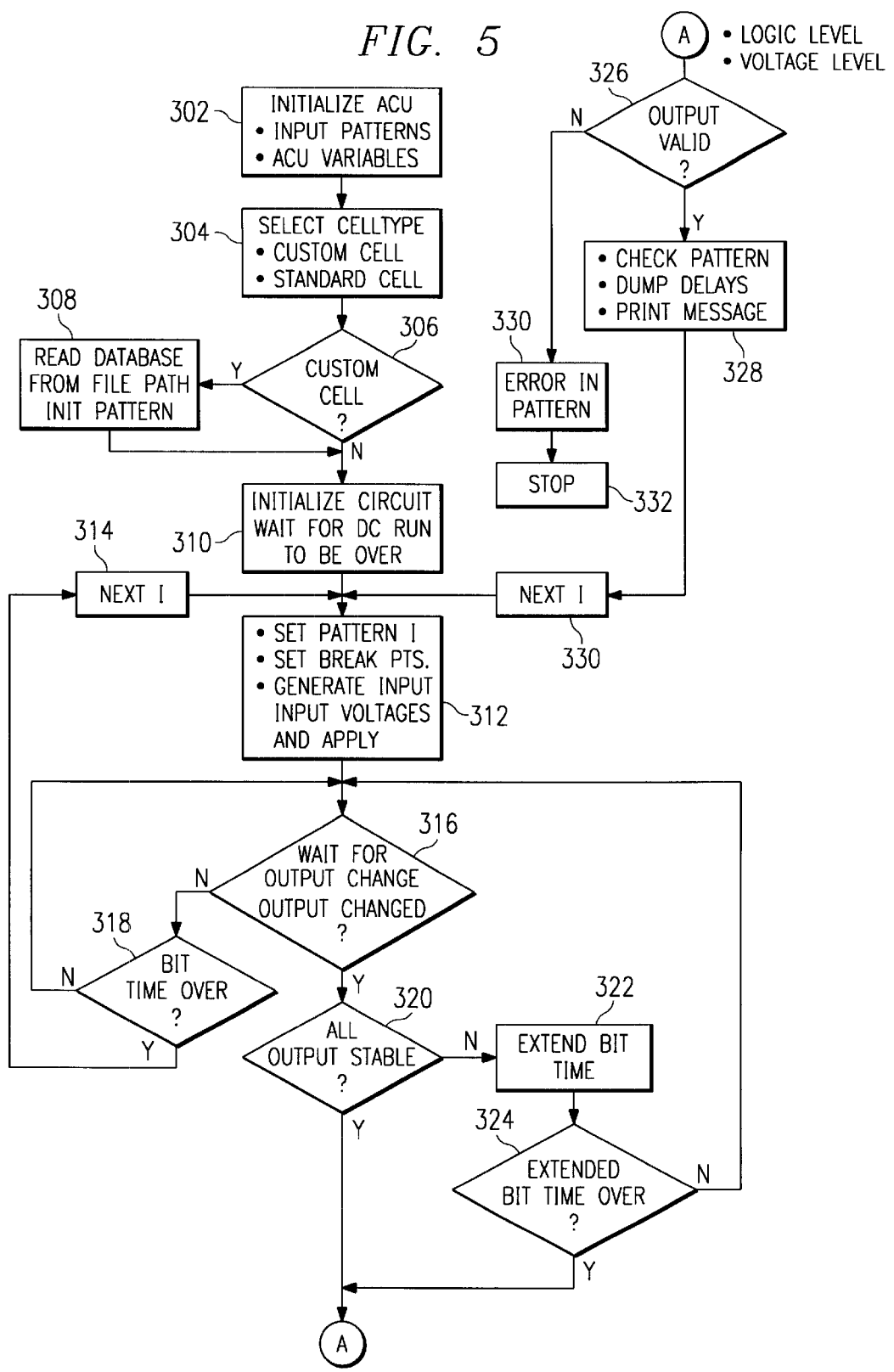

KNOWLEDGE DRIVEN SIMULATION TIME AND DATA REDUCTION TECHNIQUE

This application is a Continuation of application Serial No. 08/385,246 filed on Feb. 7, 1995, which is abandoned.

TECHNICAL FIELD OF THE INVENTION

This invention relates to simulation and more particularly to simulation of digital circuits.

BACKGROUND OF THE INVENTION

In the simulation of digital circuits, the designer of digital circuits has designed a particular digital circuit for an expected behavior of the digital circuit. These designer during the design process should verify the actual behavior of the digital circuit with the expected behavior of the digital circuit. This verification can be accomplished through the use of simulation. The designer may provide an input and input pattern sequence for the digital circuit to a simulator in order to test the digital circuit. Simulation has long been an essential step in the design and manufacture of circuits.

Accordingly, many simulators have been developed and marketed. One widely used circuit simulator is a program which has been developed at the Electronics Research Laboratory of University of California, Berkley, known as SPICE. In general, SPICE is a system for simulating non-linear circuits in time using non-linear time-independent generalized admittance representations. A popular version of SPICE (SPICE 2) is described "SPICE Version 2G.6 User's Guide "Berkley-University of California, Department of Electrical Engineering and Computer Science, 1980 by Vladimirescu, et al." incorporated herein by reference in its entirety.

Circuit simulators are typically software based and are designed to accept a description of the circuit which defines the circuit topology and element values. Each element in the circuit is typically specified by an element line containing the element name, the connecting node and the electrical parameter values. Simulators typically simulate circuitries which include passive devices such as resistors, capacitors, diodes, inductors and mutual inductors, stimuli, such as voltage and current sources and active devices such as bipolar junction transistors (BJT), junction field effect transistors (JFET) and metal oxide semiconductor field effect transistors (MOSFET). The simulator can typically be configured to perform DC analysis, AC small signal analysis and transient analysis. SPICE is descendant of a simulator known as Cancer, L. W. Nagel and R. A. Rohrer "Computer Analysis of Non-Linear Circuits, Excluding Radiation (Cancer)" IEEE J. Solid-State Circuits, Volume SC-6, page 166–182 (August, 1971). Additionally, incorporated herein by reference in their entirety. SPICE and other integrated circuits simulators typically include a lumped parameter characterization of ideal components used in an integrated circuit. These include passive components such as resistors, inductors and capacitors. Active components may be provided by models which include a specification of various structural feature and parameters that affect their operation. After the design of the circuit, the designer typically generates at a keyboard input to a computer, a line of code which specifies each device in the circuit. The active devices are typically specified by an identifying number, a set of node numbers which identify the circuit nodes to which the device terminals are attached, whether the device is a N or P type, the device width and length and model assigned to simulate operation of the device. The model assigned to simulate a particular device depends on several factors. First, if the device is connected to a power supply or a ground node, a different model may be selected if the device is not so connected. Secondly, some models are suitable for modeling P type devices where as other devices are designed to model N type devices. Finally, a particular model is typically suitable only for devices given a given size range. Thus, the circuit designer is faced with designing a particular model for each device in the circuit. This prevents a tedious task for an integrated circuit having several thousand active devices.

Data specifying a particular model is referred to a model card, while data specifying a particular device is referred to a device card. Each set of data includes a line of code as a listing. Such nomenclature stems from the days when punched computer cards contained the data necessary for each specified model or device. All of the device cards and model cards are referred to collectively as a SPICE deck. The model cards are developed by empirical testing of a physical device and may be used in simulations and different circuits made with similar processes. The device cards are typically hand coded, for example data is entered at a keyboard for a particular circuit design. When the SPICE deck is loaded into a computer program with an electronic circuit simulator, the computer simulates operation of the circuit.

However, the simulation of digital circuits using SPICE is time consuming, especially for large designs of these digital circuits and in the library cell characterization of these circuits. To characterize a typical digital library cell, hundreds of SPICE runs are required to provide for power supply, slew rate, temperature and load variations. The behavior of digital circuits in terms of its input and output patterns are generally known, but the minimum time required for the outputs to settle to a steady state value in order to change the inputs for the next output is not known. To utilize a standard SPICE stack that will run all the required variations, the simulation time or bit time is generally over estimated by the designer. By employing this over-estimation, the designer is reasonably confident that all of the simulations will be correctly run to the completion. This method of operating SPICE results in many undesirable problems. The time to use the SPICE program with these large designs will take an unnecessarily large amount of time if a overly large bit time is given since the large bit time is unnecessary for every SPICE run. An accurate estimate of the time required for the output of these digital circuits to settle to a steady state value, resulting from a change in input, has to be determined accurately in order to save time. If the selected bit time is small, the outputs may not settle within the selected bit time, and a rerun of the SPICE program with the same input may be required with a larger bit time. In these cases the entire time that the run has been taken has been lost. Additionally, the outputs of these digital circuits may not settle at all due to an unforeseen problem, and a rerun with a larger bit time may be required in order to establish this problem. Needless to say, each of these runs requires CPU time, and CPU time may be wasted while waiting unnecessarily for a long bit time if the output of the digital circuit has already settled.

An additional problem with a long bit time is redundancy. Data may be generated by SPICE in the form of punch files as the SPICE program simulates every time point during the SPICE run. This data may extend into a time period that is beyond the interest of the designer, resulting in data that is unnecessary.

Standard cell libraries include information corresponding to primitive gates such as an AND, OR, NAND, NOR flip-flops, etc. These circuits are simulated under varying conditions including strong, nominal and weak process variations, for example 4.5 voltage, temperature at 150° C., slew (nanoseconds) and load variations (PF). If the time from coding the input patterns to achieving results is too long, submitting these SPICE jobs and analyzing the results may discourage the designer from performing detailed simulation of the cell under all necessary conditions.

SUMMARY OF THE INVENTION

The present invention now reduces the simulation time from dependency on the bit time and the estimations based on the bit time. The present invention advantageously schedules the next input bit patterns for the SPICE program immediately when the outputs of the previous SPICE iterations has settled, allowing the designer to reuse the same SPICE deck for simulation involving variations in power supply, temperature slew and load conditions.

The present invention reduces data requirements since the next run of SPICE is scheduled immediately. There is no output of the program other than the output associated with the required run. The idle time that had been spent in waiting for the next set of input conditions has been reduced or eliminated, and consequently, the data produced during this idle time is eliminated. Thus, SPICE punches out a fewer number of less meaningful data points. Thus, processing time on the resulting punch files from SPICE is increased for subsequent programs or filters. The present invention eliminates the need to represent the input waveform as a piecewise linear PWL waveforms, eliminating the timing description associated with these PWL waveforms. The input output behavior can now be described as a predetermined set of patterns, for example, ASCII text.

The present invention provides instantaneous checking of the output. No longer does the entire SPICE run need to be completed when a malfunction has occurred. The present invention detects the malfunction and instantaneously stops execution of the SPICE simulation, saving time. Advantageously, the checking function can be disconnected so that a new circuit having an unknown behavior can be simulated. Furthermore, error messages can be given to the user describing the pin and the pattern on which the malfunction has occurred.

The present invention provides pin-to-pin delays every time when an output transition occurs. This eliminates the needs for post processing of the data. Additionally, the present invention can detect errors in tiling that occurred while the basic functionality of the circuit is correct, which may not be acceptable to a designer. The present invention provides break points in transition regions around signal change ensuring that the transitions are detected and sufficient number of time points are provided to a simulator to compute the delay.

DESCRIPTION OF THE DRAWINGS

FIG. 5 illustrates another flow diagram of the present invention.

DETAILED DESCRIPTION OF THE INVENTION

Any simulator having accessible and controllable internal variable, for example node currents, node voltages and simulation control variables may use either indirectly or directly user defined modules UDM. These simulators may be used with the ACU and a computer, microcomputer or minicomputer in order to use the described advantages.

Figure 1:
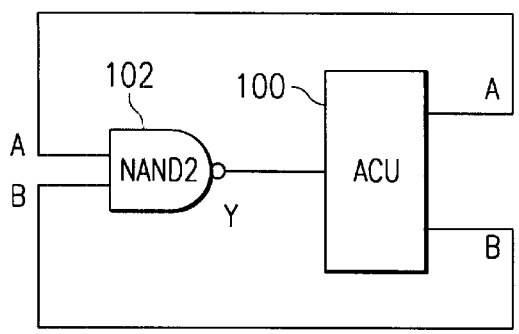
FIG. 1 illustrates a sample circuit and connected Auto Characterization User Defined Module (ACU)

FIG. 1 illustrates a connection between the sample circuit 102, for example NAND circuit and ACU 100. The input of ACU 100 is connected to the input of ACU 100; the output of the circuit 102. Additionally, the inputs to the circuit 102 is connected to output of ACU 100. The ACU 100 will schedule and output the input patterns for circuit 102 immediately after the outputs of the circuits 102 has settled to predetermined values. The ACU compares the output of the sample circuit to output signal that have been previously been input to the ACU and if the difference is with the predetermined difference, for example the noise margin 106, then the next set of input signals are applied to the sample circuit 102. Thus, the idle time between the bit time that would be spent for waiting for the next set of input values based upon a conservative bit time is eliminated. As a consequence of this reduction in wait time, the punch files are smaller as a result of eliminating the output. The processing time associated with the punch files is significantly reduced.

Figure 2:
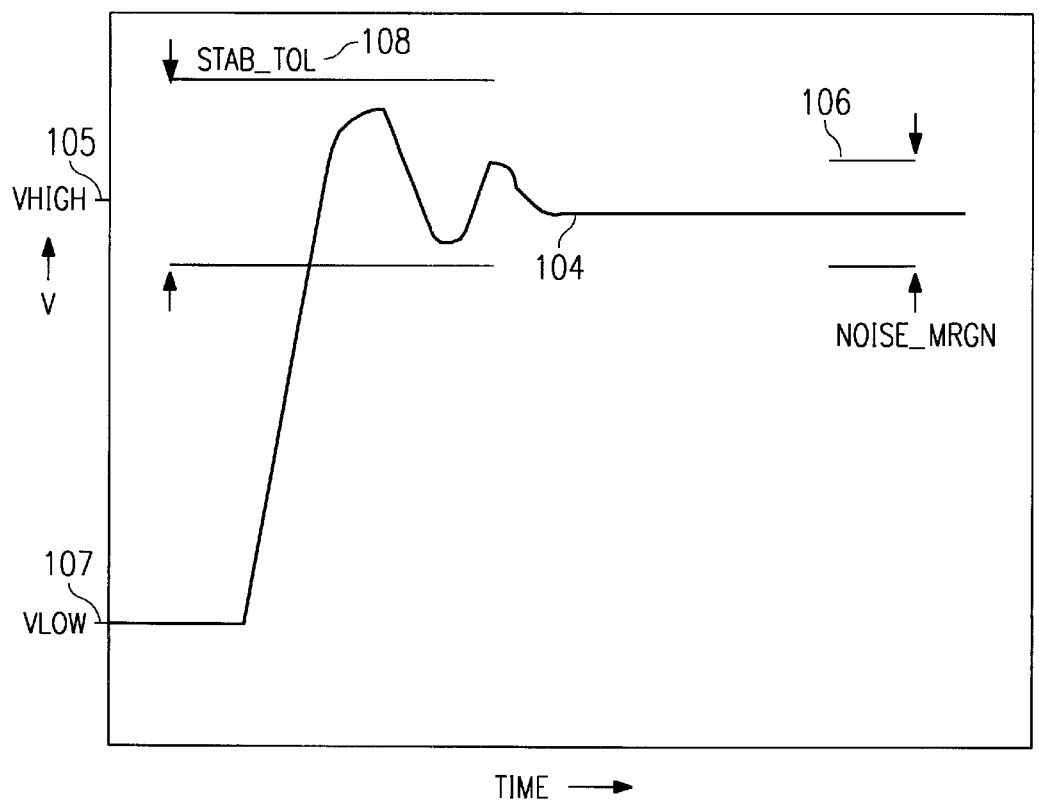
FIG. 2 illustrates the output signal parameters of the ACU.

FIG. 2 illustrates a portion of the input parameters 105 (106, 107, 108) to the ACU 100. These input parameters show how these input parameters (105, 106, 107, 108) relate to an output signal 104 from the circuit 102. The noise margin 106 may be a value which the output should settle within. This noise margin 106 is used to detect voltage level errors. For example, 3.5 volts and 5 volts may be considered an acceptable logic high level. If a noise margin value of 0.5 volts is applied to 5 volts, 3.5 volts would be less than the acceptable level of 4.5 volts, indicating an error. The stability tolerance 108 may be used to monitor the output voltage of the sample circuit 102 for a time period, for example for a predetermined time. If these output voltages average to be within the STAB TOL 108 then the wave form can be deemed to have ceased to change. The next wave form can now be applied. Thus actual values of STAB TOL 108 are used to determine when the next value can be applied as an alternative to waiting for a predetermined period of time.

Figure 3:
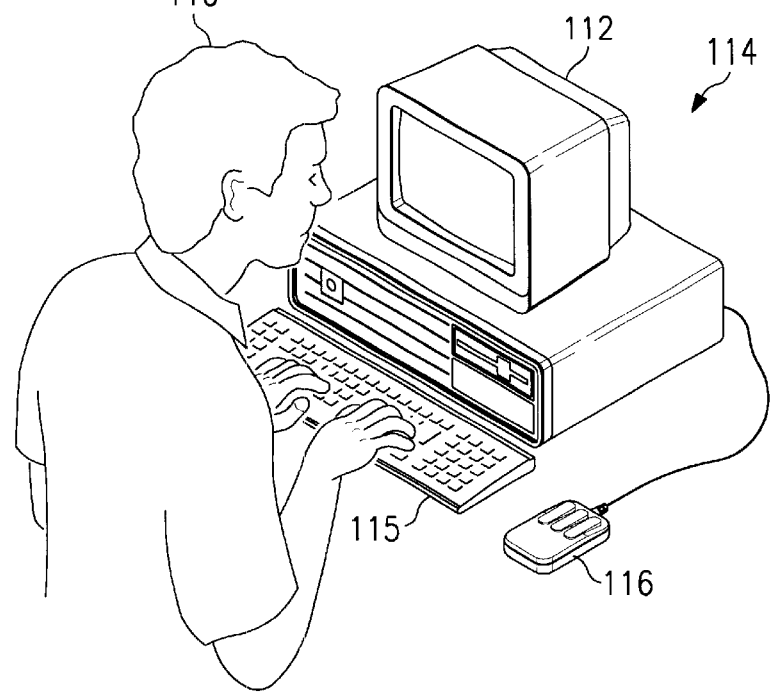
FIG. 3 illustrates a computer and user of the present invention.
Figure 4:
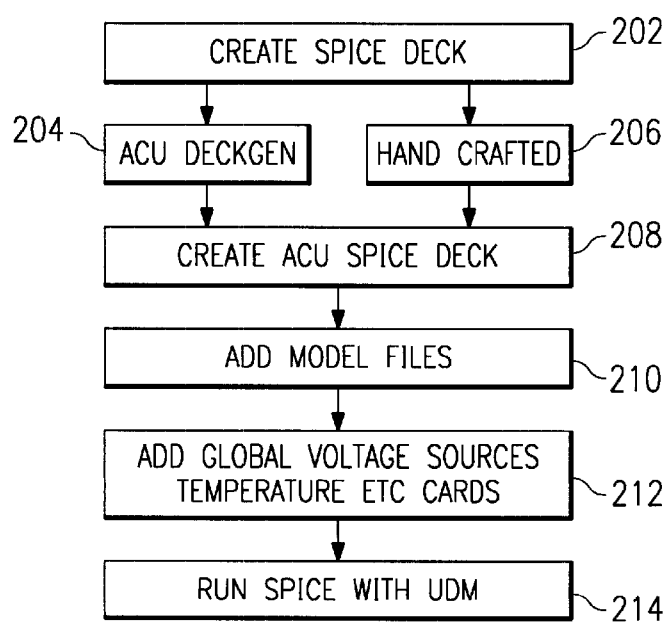
FIG. 4 illustrates a generalized flow diagram of the present invention.

FIG. 3 illustrates that the user 110 inputs and receives information to a workstation 114 having a monochrome or color monitor 112 and input devices such as keyboard 115 and mouse 116. The workstation 114 is connected to a network in order to share the information with a plurality of users. The workstation 114 inputs the necessary input parameters to the ACU 100. FIG. 4 illustrates a flow chart for running SPICE with ACU 100.

FIG. 4 illustrates the sequence of steps for creating and submitting a SPICE job using ACU 100. Block 202 creates the SPICE deck which is input both to block 204 to create the ACU deckgen and to block 206 to create the handcrafted deck. The handcrafted deck and the ACU deckgen is input to block 208 to create an ACU SPICE deck Block 210 adds model files to the ACU SPICE deck. In block 212, global voltage source temperatures and other cards are added to the ACU SPICE deck integrated with the model files. In block 214, the SPICE is run with UDM. As illustrated in FIG. 5, the operation of the ACU is illustrated. In block 302, the ACU is initialized with both input parameters and ACU variables. For example, one input parameter is the cell type which specifies the type of cell or circuit to be simulated. Default values include AND gates, NAND gates, OR gates, NOR gates, exclusive OR gates, exclusive NOR gates, inverters and buffers and various types of flip-flops. If a cell type is unsupported by the ACU, it can be implemented through an external ASCII file. Other parameters include VIN (high), VIN (low) limits on the input voltage, VOUT (high), VOUT (low) voltage level limits on the output voltage. Additionally, the maximum bit time (tbit) indicates the time beyond which the ACU will terminate the simulation. The output of circuit 102 is monitored by the ACU 100 in terms of voltage levels, namely, the noise margin 106 and the stability tolerance 108. In block 304, a cell type is selected. Either a custom cell type through an external ASCII file or a standard cell as defined herein above. In block 306, if a custom cell has been selected in block 308, the database is read from the file path which contains the input patterns for the circuit to be simulated. The circuit 102 is initialized for a DC run and the ACU 100 waits until this DC run has completed. At block 312, set pattern I, where I is an index of the input pattern and pattern break points are set and input voltages are generated and applied to circuit 102. At block 316, the ACU 100 waits for the output of circuit 102 to change. If the output has not changed and the bit time is not over, it continues to wait in block 318. If the bit time is over without the output changing I is incremented in block 314. If the output has changed in block 320, it is determined if the outputs are stable, if the outputs are not stable in block 320, the bit time is extended in block 322 and control passes to block 324. If the extended bit time is not over, then control passes to block 316. If the extended bit time is over, then the control passes to block 326. Block 326 determines if the output is valid by comparing the output with known or expected outputs within the limits previously specified by NOISE margin (106) in FIG. 2. If not, an error in output pattern of circuit 102 is displayed on monitor 112 and the program stops in block 332. If in fact, the output is valid in block 328, the pattern is checked; the delays for the test pattern and a message indicating that the test pattern has passed output to 112 on FIG. 3 in 328. In block 330, I is incremented and the control is passed to block 312.

Examples 1 and 2 illustrate the input perimeters of the prior art SPICE stack and the SPICE stack of the present invention respectively. In example 1, example statements 1–7 illustrate the input and output to the circuit. More specifically, example statements 1–7 illustrate the input to the SPICE simulator. Example statement 1 illustrates the cell-type number while example statements 2–5 illustrate the input to the SPICE simulator while example statement 6 illustrates the output of the simulator. Further, example statement 71–86 illustrates additional data for a call to the SPICE program. Example statements 88–124 illustrates the output from the input deck while statements 125–130 illustrates the output from SPICE indicating the DC solution. Statements 131–153 illustrates the TR analysis indicating differing pattern pass. Example 2 illustrates a normal deck for SPICE with example statements 217–220 illustrates a conventional input deck.

```
CELLTYPE 250
        IN    A    101111111
        IN    B    111011111
        IN    C    111110111
        IN    D    111111101
        OUT   Y    101110101
ENDCELL
* TITLE CARD : ACU deck for cell file : an4
*****************************************************************
*   INCLUDING CARDS FROM INPUT FILE
*****************************************************************
.OPTION NOTRANOUT
.TEMP 25.0
.LIB DSN /user/models/prism/mlvspn
*.LIB DSN /user/linasic/prism/spice_models/layout_rules.text noprint
VCC    DVDDL    0   DC 5.0V
VGND   DVSSL    0   DC 0.0V
.TRAN 0.1NS 1000NS
PWS = 1
PXJNSD = 1.0
PXJPSD = 1.0
*****************************************************************
*   SUBCIRCUIT FILE ( an4.sub ) PRINTED BY ACU
*****************************************************************
* Spice deck for block AN420N11 in database ddb
* Short wires will be replaced by DC 0.0 sources
* ADCAP2SPICE2 7.0E (MDS4.0/SR10.3)
* Translation done on 1/21/1993 at time 13:34:22.
* Texas Instruments Incorporated Proprietary Information
XMN4    DVSSL    DVSSL    Y      N4      D_NCH_5V_DDB    W=31.25
+ L=1.00          AS=1.0   AD=1.0  ASS=1.0  ASD=1.0 AEQS=1   M$N=N5L25L1
XMN3    DVSSL    N3       N2     C       D_NCH_5V_DDB    W=14.75
+ L=1.00          AS=1.0   AD=1.0  ASS=1.0  ASD=1.0 AEQS=1   M$N=N5L25L1
XMN2    DVSSL    N1       N4     A       D_NCH_5V_DDB    W=15.50
+ L=1.00          AS=1.0   AD=1.0  ASS=1.0  ASD=1.0 AEQS=1   M$N=N5L25L1
XMN1    DVSSL    N2       N1     B       D_NCH_5V_DDB    W=15.00
+ L=1.00          AS=1.0   AD=1.0  ASS=1.0  ASD=1.0 AEQS=1   M$N=N5L25L1
XMN0    DVSSL    DVSSL    N3     D       D_NCH_5V_DDB    W=12.50
+ L=1.00          AS=1.0   AD=1.0  ASS=1.0  ASD=1.0 AEQS=1   M$N=N5L25L1
XMP4    DVDDL    Y        N4     DVDDL   D_PCH_5V_DDB    W=30.25
+ L=1.00          AS=1.0   AD=1.0  ASS=1.0  ASD=1.0 AEQS=1.0
+ M$N=P5L25L1
```

-continued

```
XMP3    DVDDL   N4      A       DVDDL   D_PCH_5V_DDB    W=10.00
+ L=1.00         AS=1.0  AD=1.0  ASS=1.0 ASD=1.0 AEQS=1.0
+ M$N=P5L25L1
XMP2    DVDDL   N4      B       DVDDL   D_PCH_5V_DDB    W=11.00
+ L=1.00         AS=1.0  AD=1.0  ASS=1.0 ASD=1.0 AEQS=1.0
+ M$N=P5L25L1
XMP1    DVDDL   N4      C       DVDDL   D_PCH_5V_DDB    W=13.50
+ L=1.00         AS=1.0  AD=1.0  ASS=1.0 ASD=1.0 AEQS=1.0
+ M$N=P5L25L1
XMP0    DVDDL   N4      D       DVDDL   D_PCH_5V_DDB    W=15.75
+ L=1.00         AS=1.0  AD=1.0  ASS=1.0 ASD=1.0 AEQS=1.0
+ M$N=P5L25L1
.SUBCKT D_NCH_5V_DDB    BGMN    SOURCE  DRAIN   GATE    AD = 1.0
+ AEQS=1         AS=1.0  ASD=1.0 ASS=1.0 L=1.2   M$N=N5LXXLYY    W=4
M_NCH_5V         DRAIN   GATE    SOURCE  BGMN    %M$N%   L=(L)   W=(W)
+ AD=#AEQS*(W*PWS) + (1−AEQS) *AD#
+ AS=#AEQS*(W*PWS) + (1−AEQS) *AS#
+ ASD=#AEQS*(3.14*PXJNSD*(W+PWS+2*PXJNSD)) + (1−AEQS) *ASD#
+ ASS=#AEQS*(3.14*PXJNSD*(W+PWS+2*PXJNSD)) + (1−AEQS) *ASS#
.ENDS D_NCH_5V_DDB
.SUBCKT D_PCH_5V_DDB    BGMP    DRAIN   GATE    SOURCE  AD=1.0
+ AEQS=1         AS=1.0  ASD=1.0 ASS=1.0 L=1.2   M$N=N5LXXLYY    W=4
M_PCH_5V         DRAIN   GATE    SOURCE  BGMP    %M$N%   L=(L)   W=(W)
+ AD=#AEQS*(W*PWS) + (1−AEQS) *AD#
+ AS=#AEQS*(W*PWS) + (1−AEQS) *AS#
+ ASD=#AEQS*(3.14*PXJPSD*(W+PWS+2*PXJPSD)) + (1−AEQS) *ASD#
+ ASS=#AEQS*(3.14*PXJPSD*(W+PWS+2*PXJPSD)) + (1−AEQS) *ASS#
.ENDS D_PCH_5V_DDB
****************************************************************
*   ACU DECK BEGINS HERE :
****************************************************************
EA A 0 USER(1) Y 0
+ acu (0, 2, 4, 0.0, 5.0, 0.0, 5.0, 50.0, 5e−10, 2e−09, 0.10, 0.001, 0)
EB B 0 USER(1) Y 0
+ acu (1, 2, 4, 0.0, 5.0, 0.0, 5.0, 50.0, 5e−10, 2e−09, 0.10, 0.001, 0)
EC C 0 USER(1) Y 0
+ acu (2, 2, 4, 0.0, 5.0, 0.0, 5.0, 50.0, 5e−10, 2e−09, 0.10, 0.001, 0)
ED D 0 USER(1) Y 0
+ acu (3, 2, 4, 0.0, 5.0, 0.0, 5.0, 50.0, 5e−10, 2e−09, 0.10, 0.001, 0)
.PUNCH TRAN V ( A B C D )
.PUNCH TRAN V ( Y )
****************************************************************
*   ACU DECK ENDS HERE :
****************************************************************
.END
* MESSAGE * Attempting to load UDMs for the Analysis phase . . .
SPICE3: circuit = an4.acu
Analysis Temperature = 25 degree C.
Doing Transient analysis.
* MESSAGE * Trying automatic DC convergence algorithms . . .
****************************************************************
* ACU - Auto Characterization UDM (TI-SPICE 3)            *
* Developed by : Srikanth N, C Srinivasan, Vivek G Pawar  *
* TI India, Linear.                                       *
* Version : 0.2                                           *
* Last Compiled on : 2 Apr 1993                           *
****************************************************************
ACU NOTE : Printing delay values in file : delay.acu
     Gate (2) is      : AND
     Nof input pins   : 4
     Nof output pins  : 1
     Input    Pattern [0] : 101111111
     Input    Pattern [1] : 111011111
     Input    Pattern [2] : 111110111
     Input    Pattern [3] : 111111101
     Output   Pattern [0] : 101010101
* ACU input values are :
     CellType        = 2
     NumInputPins    = 4
     InputLowV       = 0
     InputHighV      = 5
     OutLowV         = 0
     OutHighV        = 5
     Vtin            = 2.5
     Slew            = 5e−10
     DelayTime       = 2e−09
     NoiseMargin     = 0.1
     StabTol         = 0.001
     Flag            = 0
```

-continued

```
    UDM dimension  = 1
    Num. of Patterns = 9
* MESSAGE * ****************************************
* MESSAGE * DC convergence was obtained with:
* MESSAGE * .OPTIONS ALGDC=1 ITL1=200 ITLBJT=1
* MESSAGE * .OPTIONS CKDC=2.5
* MESSAGE * .DEFAULT M IC=0 0 0
* MESSAGE * ****************************************
    TPLH-D-Y-LH = −2.48658e−09
    TPHL-A-Y-LH = 9.20531e−10
* Passed test for pattern 0
    TPHL-A-Y-HL = 7.3115e−10
* Passed test for pattern 1
    TPLH-A-Y-LH = 7.44472e−10
* Passed test for pattern 2
    TPHL-B-Y-HL = 8.31008e−10
* Passed test for pattern 3
    TPLH-B-Y-LH = 8.6839e−10
* Passed test for pattern 4
    TPHL-C-Y-HL = 7.92967e−10
* Passed test for pattern 5
    TPLH-C-Y-LH = 9.52924e−10
* Passed test for pattern 6
    TPHL-D-Y-HL = 7.6166e−10
* Passed test for pattern 7
    TPLH-D-Y-LH = 1.0068e−09
* Passed test for pattern 8
*************************************************************
*       Congratulations ! Simulation Successful!            *
*************************************************************
Total ANALYSIS time = 9.30074 seconds
* TITLE CARD : ACU deck for cell file : an4
*************************************************************
*    INCLUDING CARDS FROM INPUT FILE
*************************************************************
.OPTION NOTRANOUT
.TEMP 25.0
.LIB DSN /user/models/prism/mlvspn
*.LIB DSN /user/linasic/prism/spice_models/layout_rules.text noprint
VCC    DVDDL    0    DC  5.0V
VGND   DVSSL    0    DC  0.0V
.TRAN 0.1NS 1000NS
PWS = 1
PXJNSD = 1.0
PXJPSD = 1.0
*************************************************************
*    SUBCIRCUIT FILE ( an4.sub ) PRINTED BY ACU
*************************************************************
* Spice deck for block AN420N11 in database ddb
* Short wires will be replaced by DC 0.0 sources
* ADCAP2SPICE2 7.0E (MDS4.0/SR10.3)
* Translation done on 1/21/1993 at time 13:34:22.
* Texas Instruments Incorporated Proprietary Information
XMN4     DVSSL    DVSSL    Y      N4       D_NCH_5V_DDB    W=31.25
+ L=1.00           AS=1.0   AD=1.0 ASS=1.0  ASD=1.0 AEQS=1  M$N=N5L25L1
XMN3     DVSSL    N3       N2     C        D_NCH_5V_DDB    W=14.75
+ L=1.00           AS=1.0   AD=1.0 ASS=1.0  ASD=1.0 AEQS=1  M$N=N5L25L1
XMN2     DVSSL    N1       N4     A        D_NCH_5V_DDB    W=15.50
+ L=1.00           AS=1.0   AD=1.0 ASS<1.0  ASD=1.0 AEQS=1  M$N=N5L25L1
XMN1     DVSSL    N2       N1     B        D_NCH_5V_DDB    W=15.00
+ L=1.00           AS=1.0   AD=1.0 ASS=1.0  ASD=1.0 AEQS=1  M$N=N5L25L1
XMN0     DVSSL    DVSSL    N3     D        D_NCH_5V_DDB    W=12.50
+ L=1.00           AS=1.0   AD=1.0 ASS=1.0  ASD=1.0 AEQS=1  M$N=N5L25L1
XMP4     DVDDL    Y        N4     DVDDL    D_PCH_5V_DDB    W=30.25
+ L=1.00           AS=1.0   AD=1.0 ASS=1.0  ASD=1.0 AEQS=1.0
+ M$N=P5L25L1
XMP3     DVDDL    N4       A      DVDDL    D_PCH_5V_DDB    W=10.00
+ L=1.00           AS=1.0   AD=1.0 ASS=1.0  ASD=1.0 AEQS=1.0
+ M$N=P5L25L1
XMP2     DVDDL    N4       B      DVDDL    D_PCH_5V_DDB    W=11.00
+ L=1.00           AS=1.0   AD=1.0 ASS=1.0  ASD=1.0 AEQS=1.0
+ M$N=P5L25L1
XMP1     DVDDL    N4       C      DVDDL    D_PCH_5V_DDB    W=13.50
+ L=1.00           AS=1.0   AD=1.0 ASS=1.0  ASD=1.0 AEQS=1.0
+ M$N=P5L25L1
XMP0     DVDDL    N4       D      DVDDL    D_PCH_5V_DDB    W=15.75
+ L=1.00           AS=1.0   AD=1.0 ASS=1.0  ASD=1.0 AEQS=1.0
+ M$N=P5L25L1
```

-continued

```
.SUBCKT D_NCH_5V_DDB     BGMN      SOURCE   DRAIN   GATE       AD = 1.0
+ AEQS=1                 AS=1.0    ASD=1.0  ASS=1.0 L=1.2      M$N=N5LXXLYY     W=4
M_NCH_5V                 DRAIN     GATE     SOURCE  BGMN       %M$N%      L=(L)    W=(W)
+ AD=#AEQS*(W*PWS) + (1-AEQS) *AD#
+ AS=#AEQS*(W*PWS) + (1-AEQS) *AS#
+ ASD=#AEQS*(3.14*PXJNSD*(W+PWS+2*PXJNSD)) + (1-AEQS) *ASD#
+ ASS=#AEQS*(3.14*PXJNSD*(W+PWS+2*PXJNSD)) + (1-AEQS) *ASS#
.ENDS D_NCH_5V_DDB
.SUBCKT D_PCH_5V_DDB     BGMP      DRAIN    GATE    SOURCE     AD=1.0
+ AEQS=1                 AS=1.0    ASD=1.0  ASS=1.0 L=1.2      M$N=N5LXXLYY     W=4
M_PCH_5V                 DRAIN     GATE     SOURCE  BGMP       %M$N%      L=(L)    W=(W)
+ AD=#AEQS*(W*PWS) + (1-AEQS) *AD#
+ AS=#AEQS*(W*PWS) + (1-AEQS) *AS#
+ ASD=#AEQS*(3.14*PXJPSD*(W+PWS+2*PXJPSD)) + (1-AEQS) *ASD#
+ ASS=#AEQS*(3.14*PXJPSD*(W+PWS+2*PXJPSD)) + (1-AEQS) *ASS#
.ENDS D_PCH_5V_DDB
va   a    0 pwl 0n 0 5n 0 6n 5.0 15n    5.0  16n   0   40n   0   41n   5.0
vb   b    0 pwl 0n 0 5n 0 6n 5.0 50n    5.0  51n   0   75n   0   76n   5.0
vc   c    0 pwl 0n 0 5n 0 6n 5.0 80n    5.0  81n   0   105n  0   106n  5.0
vd   d    0 pwl 0n 0 5n 0 6n 5.0 110n   5.0  111n  0   135n  0   136n  5.0
.PUNCH TRAN V( A B C D )
.PUNCH TRAN V( Y )
.END
```

Other Embodiments

Although the present invention and its advantages have been described in detail, it should be understood that various changes, substitutions and alterations can be made herein without departing from the spirit and scope of the invention as defined by the appended claims.

What is claimed is:

1. A simulator for simulating a digital circuit, comprising:

an input circuit for inputting a plurality of test patterns to describe the characteristics of the digital circuit and for inputting a plurality of input signals to test the operation of digital circuit and a plurality of output signals to describe the expected output of the digital circuit based on the plurality of input signals;

an applying circuit to apply the input signals to test the operation of the digital circuit to said test patterns to describe the characteristics of the digital circuit to form a simulated output signal to indicate a response based on said test patterns;

a comparator circuit to compare said simulated output signal with the output signals to describe the expected output of the digital circuit based on the plurality of input signals to determine a difference between the simulated output signal and said output signals, wherein the operation of the simulation is stopped if said difference is greater than a threshold difference.

2. A simulation for simulating a digital circuit as in claim 1, wherein said comparator of said simulated output signal with the output signal to describe the expected output of the digital circuit is delayed a predetermined period of time.

3. A simulation for simulating a digital circuit as in claim 1, where said simulation is a SPICE simulator.

4. A simulation for simulating a digital circuit as in claim 1, wherein said comparator of said simulator output signal with the output signal to describe the expected output of the digital circuit is delayed based on predetermining signal.

5. A computer implemented method for simulating a digital circuit, comprising:

inputting a plurality of test patterns to describe the characteristics of the digital circuit and for inputting a plurality of input signals to test the operation of digital circuit and a plurality of output signals to describe the expected output of the digital circuit based on the plurality of input signals;

applying the input signals to test the operation of the digital circuit to said test patterns to describe the characteristics of the digital circuit to form a simulated output signal to indicate a response based on said test patters;

comparing said simulated output signal with the output signal to describe the expected output of the digital circuit based on the plurality of input signals to determine a difference between the simulated output signal and said output signals, wherein the operation of the simulation is stopped if said difference is greater than a predetermined difference.

6. A computer implemented method for simulating a digital circuit as in claim 5, wherein said comparator of said simulated output signal with the output signal to describe the expected output of the digital circuit is delayed a predetermined period of time.

7. A computer implemented method for simulating a digital circuit as in claim 5, wherein said comparator of said simulated output signal with the output signal to describe the expected output of the digital circuit is delayed based on predetermining signal.

* * * * *

UNITED STATES PATENT AND TRADEMARK OFFICE
CERTIFICATE OF CORRECTION

PATENT NO.      : 6,393,385 B1
DATED           : May 21, 2002
INVENTOR(S)     : Vivek Pawar et al.

It is certified that error appears in the above-identified patent and that said Letters Patent is hereby corrected as shown below:

<u>Title page,</u>
Item [*] Notice, delete "0" and insert -- 1159 --.

Signed and Sealed this

Eighteenth Day of May, 2004

JON W. DUDAS
*Acting Director of the United States Patent and Trademark Office*